(12) United States Patent
Kuromizu

(10) Patent No.: US 7,672,347 B2
(45) Date of Patent: Mar. 2, 2010

(54) SEMICONDUCTOR LIGHT EMITTING DEVICE

(75) Inventor: Yuichi Kuromizu, Kanagawa (JP)

(73) Assignee: Sony Corporation, Tokyo (JP)

( * ) Notice: Subject to any disclaimer, the term of this patent is extended or adjusted under 35 U.S.C. 154(b) by 186 days.

(21) Appl. No.: 11/125,703

(22) Filed: May 10, 2005

(65) Prior Publication Data

US 2005/0271105 A1    Dec. 8, 2005

(30) Foreign Application Priority Data

May 14, 2004   (JP) ............................. P2004-144960

(51) Int. Cl.
*H01S 5/00* (2006.01)
(52) U.S. Cl. .............. 372/46.01; 372/43.01; 372/44.01; 372/45.01; 372/46.013
(58) Field of Classification Search ............. 372/46.01, 372/43.01, 44.01, 45.01, 46.013
See application file for complete search history.

(56) References Cited

U.S. PATENT DOCUMENTS

| | | | | |
|---|---|---|---|---|
| 5,493,577 A | * | 2/1996 | Choquette et al. ...... | 372/46.013 |
| 5,719,891 A | * | 2/1998 | Jewell .................... | 372/46.013 |
| 6,232,209 B1 | * | 5/2001 | Fujiwara et al. ............ | 438/585 |
| 6,233,266 B1 | * | 5/2001 | Kawasumi ............... | 372/46.01 |
| 2003/0183856 A1 | * | 10/2003 | Wieczorek et al. .......... | 257/285 |
| 2004/0099857 A1 | * | 5/2004 | Song et al. .................... | 257/12 |

* cited by examiner

*Primary Examiner*—Minsun Harvey
*Assistant Examiner*—Yuanda Zhang
(74) *Attorney, Agent, or Firm*—Sonnenschein Nath & Rosenthal LLP

(57) ABSTRACT

A semiconductor light emitting device includes: a substrate; a laminate structure including a first semiconductor layer, an active layer, and a second semiconductor layer; and a current confinement part for limiting a current injection region of the active layer in the second semiconductor layer, or between the active layer and the second semiconductor layer, on the substrate, wherein the current confinement part includes a current confinement layer having a conductive region corresponding to the current injection region of the active layer and a non-conductive region corresponding to a region other than the current injection region of the active layer, and an intermediate layer provided between the current confinement layer and the second semiconductor layer or the active layer in order to prevent a mixed crystal from being formed between the current confinement layer and the second semiconductor layer or the active layer.

8 Claims, 16 Drawing Sheets

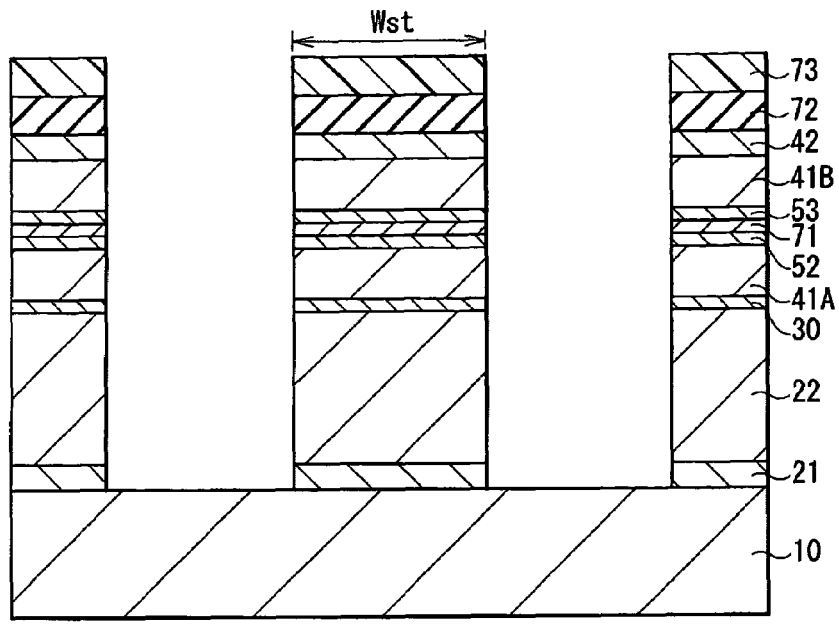
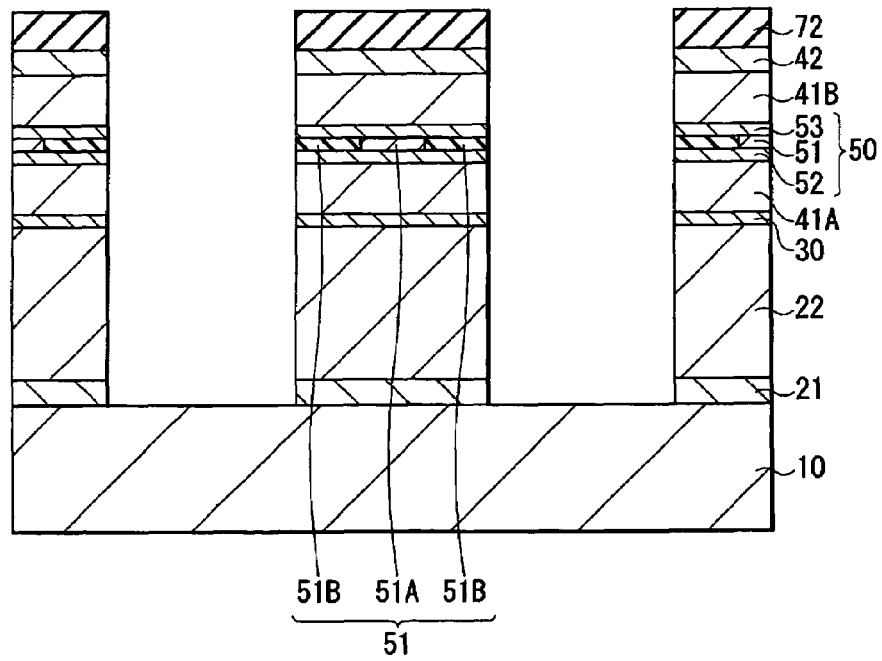

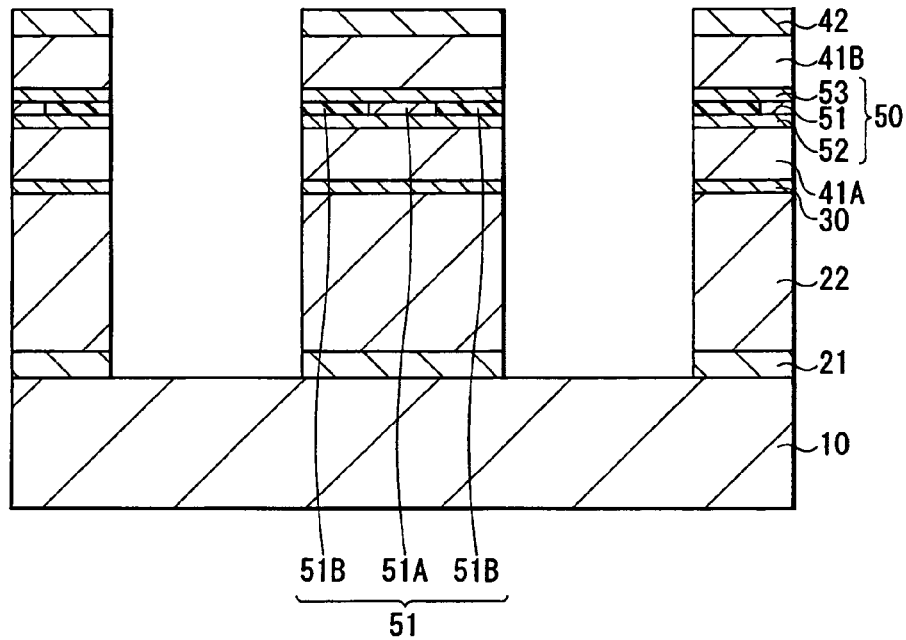
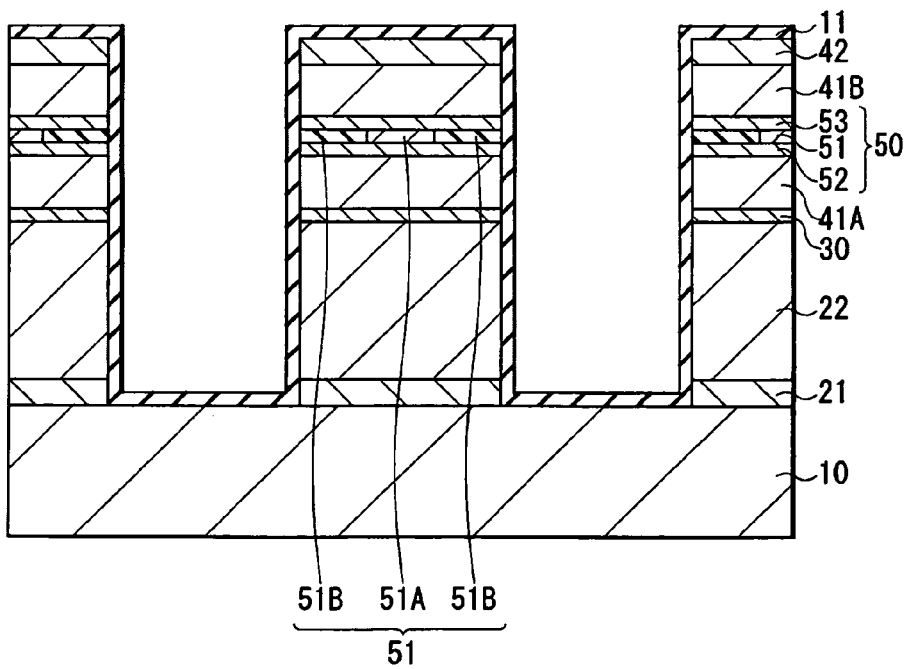

SEMICONDUCTOR LIGHT EMITTING DEVICE

RELATED APPLICATION DATA

The present application claims priority to Japanese Application(s) No(s). P2004-144960 filed May 10, 2004, which application(s) is/are incorporated herein by reference to the extent permitted by law.

BACKGROUND OF THE INVENTION

1. Field of the Invention

The present invention relates to a semiconductor light emitting device including a current confinement layer formed by oxidation, particularly to a semiconductor light emitting device suitable for a red laser with a wavelength of around 600 nm to 700 nm.

2. Description of the Related Art

A laser diode whose parent material is AlGaInP provides red light emitting with a wavelength of 600 nm to 700 nm. Such a laser diode is widely used as a light source for performing high density recording by a DVD (Digital Versatile Disc) and the like.

FIG. 1 shows a cross section configuration of such a traditional red laser diode using AlGaInP. In the laser diode, for example, on a substrate 110 made of n-type GaAs, an n-type cladding layer 122 made of an n-type AlGaInP mixed crystal, an active layer 130 having MQW (Multiple Quantum Well) structure, a p-type cladding layer 141 made of a p-type AlGaInP mixed crystal, and a p-side contact layer 142 made of p-type GaAs are sequentially laminated. On the p-side contact layer 142, a p-side electrode 161 is provided. On the rear side of the substrate 110, an n-side electrode 162 is provided. Further, part of the p-type cladding layer 141 and part of the p-side contact layer 142 are removed by etching or the like, and a stripe-shaped ridge (projecting part) 180 for current confinement is formed. On the both sides of the ridge 180, a current blocking layer 181 made of n-type GaAs or the like is formed by epitaxial growth or the like, so that a current from the p-side electrode 161 can be concentrated on the ridge 180. In this structure, however, there is a disadvantage that a contact area between the p-side electrode 161 and the p-side contact layer 142 is decreased, and a contact resistance is increased.

In order to solve such a disadvantage, for example, as shown in FIG. 2, there has been a method, in which the ridge 180 is formed in the p-type cladding layer 141, the current blocking layer 181 is buried on the both sides of the ridge 180, and then the p-side contact layer 142 is grown on the whole area of the p-type cladding layer 141 and the current blocking layer 181. However, this method has a shortcoming that the number of crystal growth is increased, leading to increase in the manufacturing cost.

As a method to perform current confinement more simply, there is a method to form a current confinement layer by oxidizing part of an AlAs layer or an AlGaAs mixed crystal layer by moisture vapor. A laser diode having such a current confinement layer by oxidation has, for example, as shown in FIG. 3, a current confinement layer 151 having a conductive region 151A made of AlAs or an AlGaAs mixed crystal and a nonconductive region 151B made of aluminum oxide between a first p-type cladding layer 141A and a second p-type cladding layer 141B (For example, as an example of a VCSEL, refer to Japanese Unexamined Patent Application Publication No. 2003-69150). The side face of the first p-type cladding layer 141A, the current confinement layer 151, and the second p-type cladding layer 141B is covered with an insulating film 111. The p-side contact layer 142 and the p-side electrode 161 are contacted through an aperture of the insulating film 111.

SUMMARY OF THE INVENTION

However, in the case of the AlGaInP red laser diode, the first p-type cladding layer 141A and the second p-type cladding layer 141B contain phosphorous (P) as a Group 5B element in the short period periodic table (hereinafter referred to as "Group V element"), meanwhile the current confinement layer 151 arranged therebetween is formed by oxidizing the AlAs layer or the AlGaAs mixed crystal layer, and therefore, the Group V element contained in the first p-type cladding layer 141A and the second p-type cladding layer 141B, and the Group V element contained in the current confinement layer 151 are different from each other. In the manufacturing steps, the first p-type cladding layer 141A containing phosphorous as a Group V element, the AlAs layer or the AlGaAs mixed crystal layer to form the current confinement layer 151 containing arsenic as a Group V element, and the second p-type cladding layer 141B containing phosphorous as a Group V element should be sequentially grown. In MOCVD (Metal Organic Chemical Vapor Deposition) method, while arsine gas ($AsH_3$), phosphine gas ($PH_3$) or the like as raw material gas containing a Group V element is continuously supplied, trimethyl gallium (TMGa), trimethyl aluminum (TMAl), trimethyl indium (TMIn) or the like as a raw material gas containing a Group 3B element in the short period periodic table (hereinafter referred to as "Group III element") is supplied to perform crystal growth. Therefore, when crystals containing different Group V elements are continuously grown, there has been a shortcoming that a mixed crystal of phosphorous (P) and arsenic (As) is easily formed in the interface therebetween. The mixed crystal varies according to growth conditions, timing of switching gas and the like, and therefore, oxidation rate of the AlAs layer or the AlGaAs mixed crystal layer is affected by the mixed crystal. Therefore, when oxidation is repeated under the same conditions, a width w0 of the nonconductive region 151B varies every oxidation, and reproducibility is decreased.

In Japanese Unexamined Patent Application Publication No. H10-223981, a structure, in which two AlGaAs mixed crystal layers having different aluminum compositions ($Al_{0.98}Ga_{0.02}As$ mixed crystal layer and $Al_{0.95}Ga_{0.05}As$ mixed crystal layer) are laminated, and each layer is oxidized with different width from each other is disclosed. The structure independently controls the width of each layer subjected to oxidation by changing the aluminum compositions and defines the width of the non-oxidized portions to be a current path in two steps. However, in this structure, the p-type cladding layer containing phosphorous as a Group V element and the AlGaAs mixed crystal layer are directly contacted as well. Therefore, a mixed crystal of phosphorous (P) and arsenic (As) is formed in the interface therebetween, and the disadvantage that reproducibility of oxidation is decreased is difficult to be solved.

In view of the foregoing problem, it is desirable to provide a semiconductor light emitting device capable of improving reproducibility of the current confinement layer by oxidation.

According to an embodiment of the invention, there is provided a semiconductor light emitting device including: a substrate; a laminate structure including a first semiconductor layer, an active layer, and a second semiconductor layer; and a current confinement part for limiting a current injection region of the active layer in the second semiconductor layer, or between the active layer and the second semiconductor layer, on the substrate, wherein the current confinement part includes a current confinement layer having a conductive region corresponding to the current injection region of the active layer and a nonconductive region corresponding to a region other than the current injection region of the active layer, and an intermediate layer provided between the current confinement layer and the second semiconductor layer or the active layer in order to prevent a mixed crystal from being formed between the current confinement layer and the second semiconductor layer or the active layer.

In the semiconductor light emitting device according to the embodiment of the invention, the intermediate layer is provided between the current confinement layer and the second semiconductor layer or the active layer. Therefore, the mixed crystal is prevented from being formed between the current confinement layer and the second semiconductor layer or the active layer, which contain different Group V elements, and reproducibility of oxidation can be improved. Consequently, stable electrical characteristics can be realized. Further, since reproducibility of strain effects on the active layer by oxidation can be improved, controllability of a polarized wave surface can be improved.

Other and further objects, features and advantages of the invention will appear more fully from the following description.

BRIEF DESCRIPTION OF THE DRAWINGS

FIGS. 8A and 8B are cross sections showing steps following the steps of FIGS. 7A and 7B;

FIGS. 9A and 9B are cross sections showing steps following the steps of FIGS. 8A and 8B;

DETAILED DESCRIPTION OF THE PREFERRED EMBODIMENT

An embodiment of the invention will be hereinafter described in detail with reference to the drawings.

Figure 4:
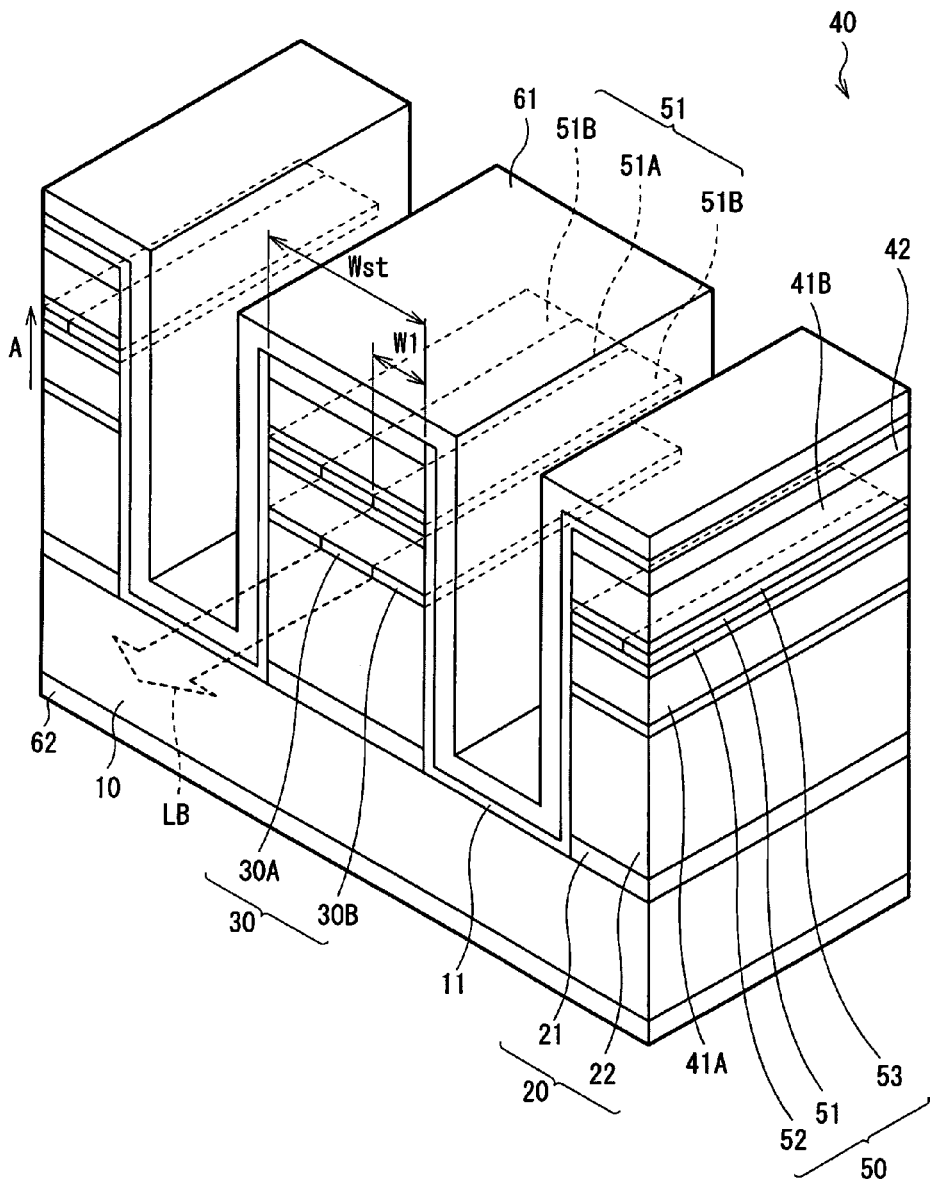
FIG. 4 is a perspective view showing a construction of a laser diode according to an embodiment of the invention.

FIG. 4 shows a structure of a laser diode according to an embodiment of the invention. This laser diode is AlGaInP red laser and has a laminated structure, in which, for example, a first semiconductor layer 20, an active layer 30 and a second semiconductor layer 40 including a current confinement part 50 are laminated on a substrate 10.

Further, in this laser diode, the second semiconductor layer 40, the active layer 30 and the first semiconductor layer 20 are three stripe-shaped projecting parts divided by two parallel grooves. Of these three stripe-shaped projecting parts, a middle projecting part functions as a laser diode. A width Wst of the middle projecting part is preferably, for example, 3 μm to 50 μm, and is more preferably 5 μm to 10 μm. In such a range, a contact area between after-mentioned p-side contact layer 42 and p-side electrode 61 is widened so that a contact resistance can be lowered and a driving voltage can be lowered.

The substrate 10 has, for example a thickness of 430 μm in the lamination direction A (hereinafter simply referred to as thickness), and is made of n-type GaAs, to which an n-type impurity such as silicon (Si) and selenium (Se) is doped. The first semiconductor layer 20 includes a buffer layer 21 and an n-type cladding layer 22 from the substrate 10 side. The buffer layer 21 has, for example, a thickness of 0.05 μm, and is made of n-type GaAs, to which an n-type impurity such as silicon and selenium is doped. The n-type cladding layer 22 has, for example, a thickness of 1.4 μm, and is made of, for example, an n-type $(Al_{0.70}Ga_{0.30})_{0.5}In_{0.5}P$ mixed crystal, to which an n-type impurity such as silicon and selenium is doped.

The active layer 30 has, for example, a thickness of 30 nm, and has a multiple quantum well structure, in which a GaInP mixed crystal layer and an AlGaInP mixed crystal layer are alternatively laminated. This active layer 30 has a current injection region 30A, into which a current is injected and a non current injection region 30B, a region other than this current injection region 30A. Of these regions, the current injection region 30A functions as a light emitting region.

The second semiconductor layer 40 has a first p-type cladding layer 41A, a second p-type cladding layer 41B and a p-side contact layer 42 from the active layer 30 side. The current confinement part 50 is provided between the first p-type cladding layer 41A and the second p-type cladding layer 41B. The first p-type cladding layer 41A has, for example, a thickness of 0.2 μm, and is made of a p-type $(Al_{0.70}Ga_{0.30})_{0.5}In_{0.5}P$ mixed crystal, to which a p-type impurity such as zinc and magnesium is doped. The second p-type cladding layer 41B has, for example, a thickness of 1.1 μm, and is made of a p-type $(Al_{0.70}Ga_{0.30})_{0.5}In_{0.5}P$ mixed crystal, to which a p-type impurity such as zinc and magnesium is doped. The p-side contact layer 42 has, for example, a thickness of 0.3 μm, and is made of p-type GaAs, to which a p-type impurity such as zinc and magnesium is doped.

The current confinement part 50 limits the current injection region 30A of the active layer 30. The current confinement part 50 includes a current confinement layer 51 having a conductive region 51A corresponding to the current injection region 30A of the active layer 30 and a nonconductive region 51B corresponding to the non current injection region 30B. The current confinement part 50 has intermediate layers 52 and 53 between the current confinement layer 51 and the first p-type cladding layer 41A, the second p-type cladding layer 41B as a buffer layer to prevent a mixed crystal from being formed therebetween. Thereby, in this laser diode, it is possible to prevent the current confinement layer 51 and the p-type cladding layer 41A, the second p-type cladding layer 41B, which contain different Group V elements, from being directly contacted, so that the mixed crystal is prevented from being formed therebetween, and reproducibility of oxidation can be improved.

The conductive region 51A and the nonconductive region 51B of the current confinement layer 51 are formed in the shape of a stripe. Further, the nonconductive region 51B is formed on the both sides of the conductive region 51A in the shape of a stripe. The conductive region 51A is made of, for example, a Group III-V compound semiconductor containing at least aluminum (Al) among Group III elements and at least arsenic (As) among Group V elements. Specifically, the conductive region 51A is made of, for example, AlAs or an AlGaAs mixed crystal. The nonconductive region 51B is made of, for example, an insulating oxide containing aluminum (Al). Specifically, the nonconductive region 51B is made of, for example, aluminum oxide ($AlO_x$, $AlGaO_x$).

The intermediate layers 52 and 53 are made of, for example, a Group III-V compound semiconductor containing at least one of aluminum (Al) and gallium (Ga) among Group III elements and at least arsenic (As) among Group V elements. Specifically, the intermediate layers 52 and 53 are made of, for example, an AlGaAs mixed crystal.

A composition of aluminum contained in the intermediate layers 52 and 53 is preferably 0.4 or more. In this range, it is possible to obtain a large band gap to the degree that there is no absorption of emission wavelengths from the active layer 30.

Figure 5:
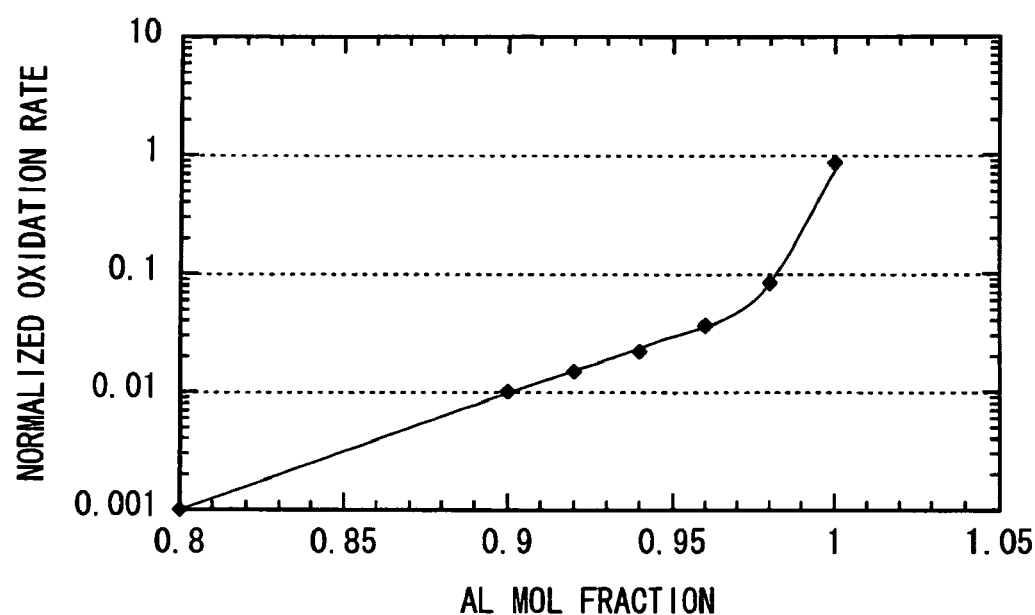
FIG. 5 is a view showing aluminum composition dependability of the oxidation rate of an AlGaAs mixed crystal.

Further, the composition of aluminum contained in the intermediate layers 52 and 53 is preferably 0.98 or less, and more preferably 0.9 or less. When the aluminum composition in the intermediate layers 52 and 53 is large, during forming the current confinement layer 51 by oxidation in the manufacturing step, the intermediate layers 52 and 53 are also significantly oxidized as the current confinement layer 51, and part of supplied oxygen is consumed for oxidizing the intermediate layers 52 and 53. Therefore, reproducibility of the oxidation rate may be deteriorated. The oxidation rate of an $Al_yGa_{1-y}As$ mixed crystal depends on the aluminum composition y as shown in FIG. 5. Therefore, by setting the aluminum composition contained in the intermediate layers 52 and 53 to 0.98 or less, more preferably to 0.9 or less, during forming the current confinement layer 51 by oxidation, it is possible to generate a difference of about 10 times or more between the oxidation rate of the non-oxidized layer made of AlAs or the AlGaAs mixed crystal and the oxidation rate of the intermediate layers 52 and 53, so that the intermediate layers 52 and 53 are not oxidized actually. Here, FIG. 5 shows a result of an experiment for examining aluminum composition dependability of the oxidation rate of $Al_yGa_{1-y}As$.

Figure 6:
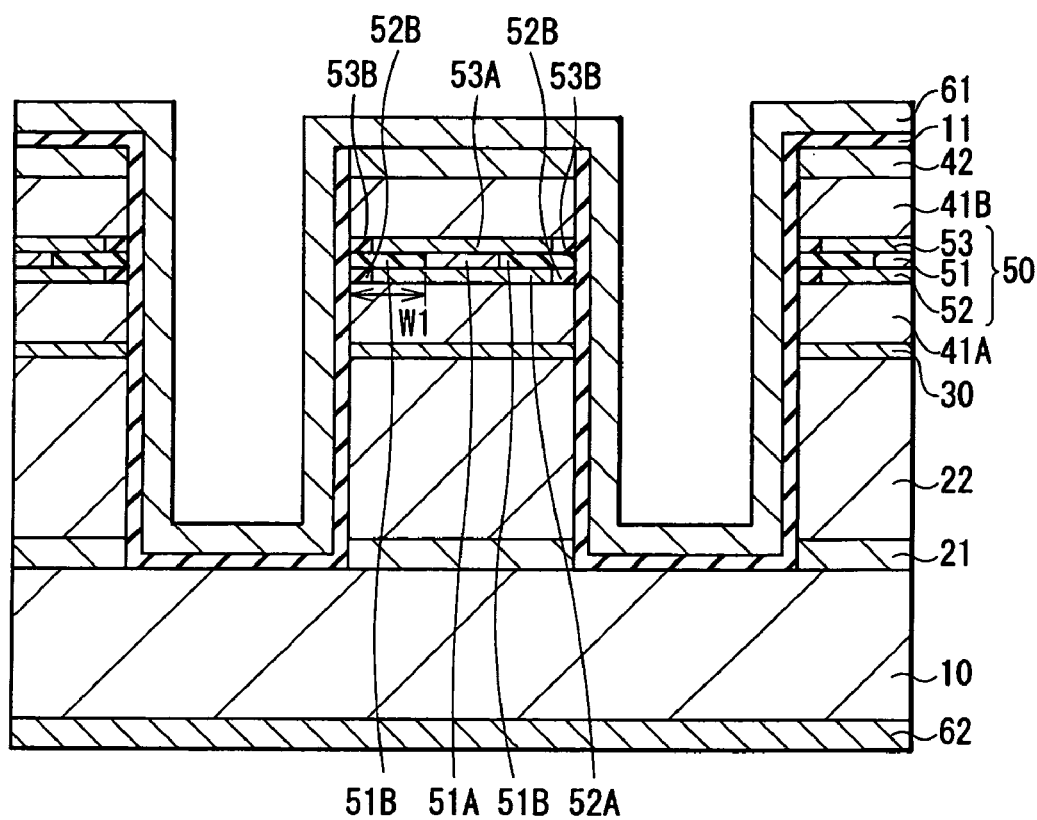
FIG. 6 is a cross section showing a modification of the laser diode shown in FIG. 4.

It is actually difficult to totally prevent oxidation of the intermediate layers 52 and 53 when the current confinement layer 51 is formed. For example, as shown in FIG. 6, the intermediate layers 52 and 53 may have intermediate conductive regions 52A and 53A corresponding to the conductive region 51A and part of the nonconductive region 51B of the current confinement layer 51, and may have intermediate nonconductive regions 52B and 53B corresponding to part of the nonconductive region 51B of the current confinement layer 51 on the both sides of the intermediate conductive regions 52A and 53A.

Further, component materials for the intermediate conductive regions 52A and 53A are similar to of the foregoing intermediate layers 52 and 53, and component materials for the intermediate nonconductive regions 52B and 53B are similar to of the foregoing nonconductive region 51B of the current confinement layer 51.

On the surface and the side face of the buffer layer 21 and the p-side contact layer 42, an insulating film 11 made of, for example, silicon dioxide ($SiO_2$) or silicon nitride (SiN) is formed. The insulating film 11 is provided with an aperture at the top face of the middle projecting part.

On the surface of the insulating film 11, the p-side electrode 61 is formed. The p-side electrode 61 has a structure, in which, for example, titanium (Ti), platinum (Pt), and gold (Au) are sequentially laminated and is electrically connected to the p-side contact layer 42 through the aperture of the insulating film 11. In this embodiment, as described above, the width Wst of the middle projecting part is wide, and current confinement is performed by the nonconductive region 51B of the current confinement layer 51. Therefore, the contact area between the p-side contact layer 42 and the p-side electrode 61 can be widened. Such a contact area is preferably widened as much as possible, since thereby the contact resistance can be lowered and the driving voltage can be lowered.

On the backside of the substrate 10, an n-side electrode 62 is formed. The n-side electrode 62 has a structure, in which, for example, AuGe:Ni and gold (Au) are sequentially laminated and alloyed by heat treatment and is electrically connected to the substrate 10.

Further, in this laser diode, a pair of opposed side faces in the resonator direction is a resonator end face. On the pair of resonator end faces, a pair of reflector films (not shown) is respectively formed. Reflectance of one of the pair of reflector films is adjusted to low reflectance, and reflectance of the other of the pair of reflector films is adjusted to high reflectance, respectively. Thereby, light generated in the active layer 30 travels between the pair of reflector films, is amplified, and is emitted in the direction perpendicular to the lamination direction A from the reflector film on the low reflectance side as a laser beam LB.

This laser diode can be manufactured as follows.

Figure 7A:
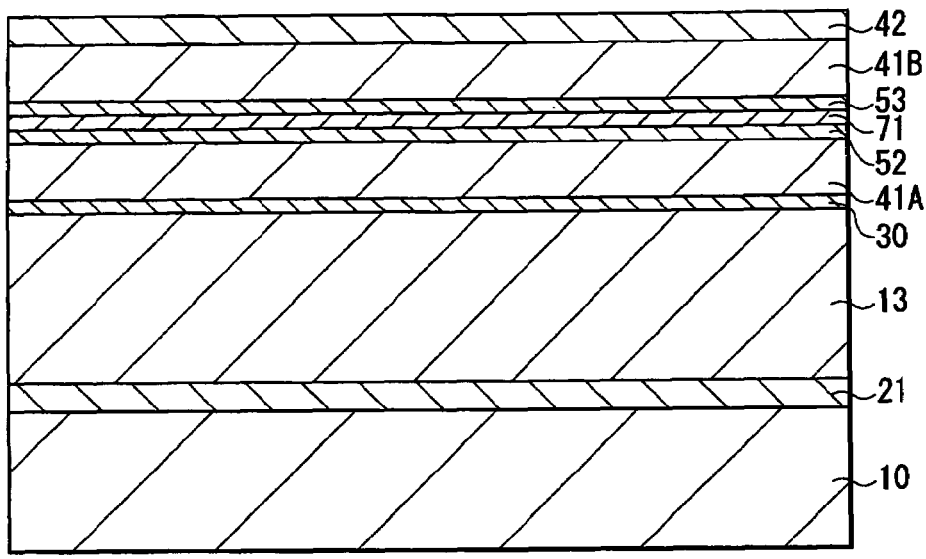
FIGS. 7A and 7B are cross sections of a method of manufacturing the laser diode shown in FIG. 4 in the order of steps.

FIGS. 7A to 10B show a method of manufacturing the laser diode according to this embodiment in the order of steps. First, as shown in FIG. 7A, for example, the substrate 10 made of the foregoing material with the foregoing thickness is prepared. On one side of the substrate 10, for example, by MOCVD (Metal Organic Chemical Vapor Deposition) method, the buffer layer 21, the n-type cladding layer 22, the active layer 30, and the first p-type cladding layer 41A are sequentially grown.

Next, similarly as shown in FIG. 7A, on the first p-type cladding layer 41A, the intermediate layer 52 made of the foregoing Group III-V compound semiconductor, a non-oxidized layer 71, and the intermediate layer 53 are formed. Subsequently, on the intermediate layer 53, the second p-type cladding layer 41B and the p-side contact layer 42 made of the foregoing material with the foregoing thickness are sequentially grown.

Figure 7B:
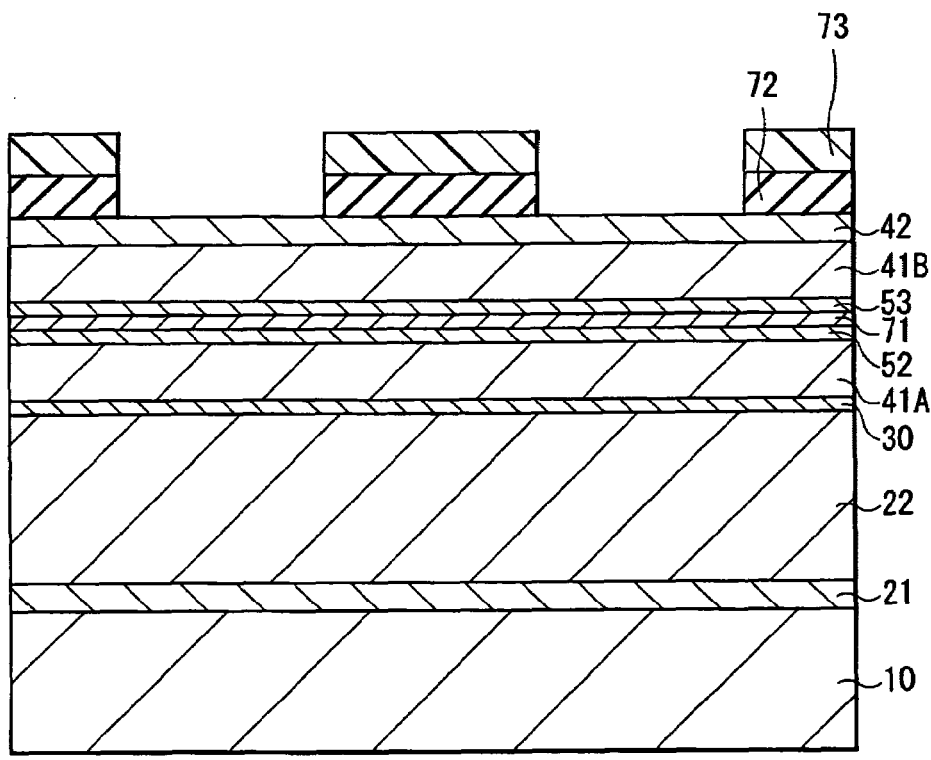

Next, as shown in FIG. 7B, for example, on the p-side contact layer 42, a mask layer 72 made of silicon dioxide and a photoresist layer 73 are formed. By utilizing the photoresist layer 73, the mask layer 72 is selectively removed by photolithography technique to expose the p-side contact layer 42.

Subsequently, as shown in FIG. 8A, for example, from the aperture of the mask layer 72, by using reactive ion etching or the like, the p-side contact layer 42, the second p-type cladding layer 41B, the intermediate layer 53, the non-oxidized layer 41, the intermediate layer 52, the first p-type cladding layer 41A, the active layer 30, the n-type cladding layer 22, and the buffer layer 21 are selectively removed down to the substrate 10 to form the three stripe-shaped projecting parts. Then, in view of process margin, a depth of the groove is preferably made to the degree such that the side face of the middle projecting part is exposed to the level under the non-oxidized layer 41 by, for example, about 0.5 µm. Further, as described before, the width Wst of the middle projecting part is preferably 3 µm to 50 µm, and more preferably 5 µm to 10 µm. In this range, the contact area between the p-side contact layer 42 and the p-side electrode 61 can be widened, and therefore, the contact resistance can be lowered, and the driving voltage can be lowered. After that, the photoresist layer 73 is removed.

After the photoresist layer 73 is removed, as shown in FIG. 8B, for example, by heating in water vapor, part of the non-oxidized layer 71 is oxidized to form the current confinement layer 51 having the non-oxidized conductive region 51A and the oxidized nonconductive region 51B. Thereby, the current confinement part 50, in which the intermediate layers 52 and 53 are arranged with the current confinement layer 51 inbetween is formed.

After the current confinement part 50 is formed, as shown in FIG. 9A, the mask layer 72 is removed. Then, as shown in FIG. 9B, on the whole area of the substrate 10, for example, by vapor deposition method, the insulating film 11 made of the foregoing material is formed.

Figure 10A:
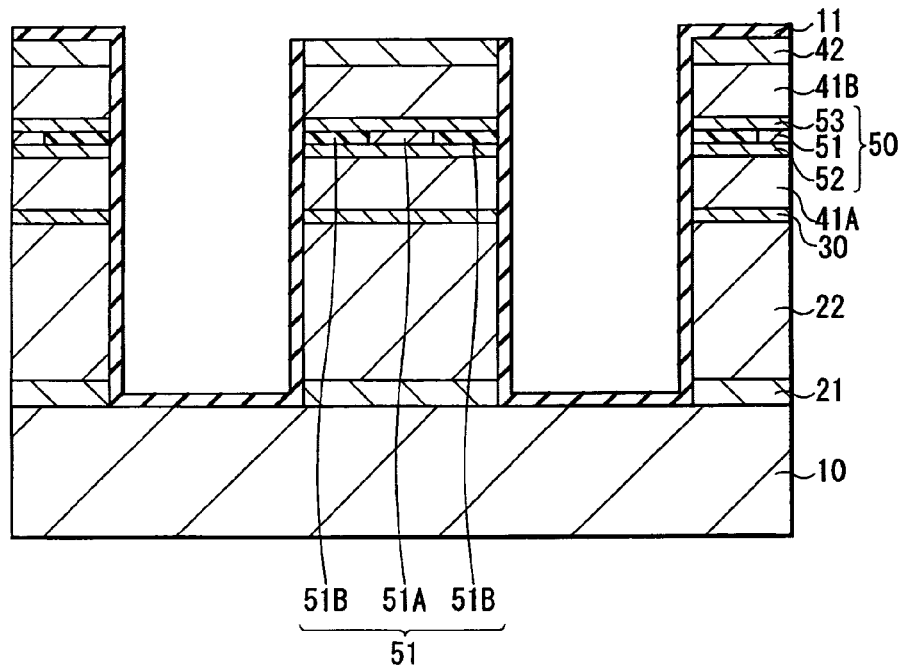
FIGS. 10A and 10B are cross sections showing steps following the steps of FIGS. 9A and 9B.

After the insulating film 11 is formed, as shown in FIG. 10A, on the insulating film 11, an unshown photoresist layer is formed and provided with patterning by, for example, photolithography. While using the photoresist layer as a mask, for example, by etching with chemical etchant or dry etching, the insulating film 11 is selectively removed to form the aperture at the top face of the middle projecting part. After that, the unshown photoresist layer is removed.

Figure 10B:
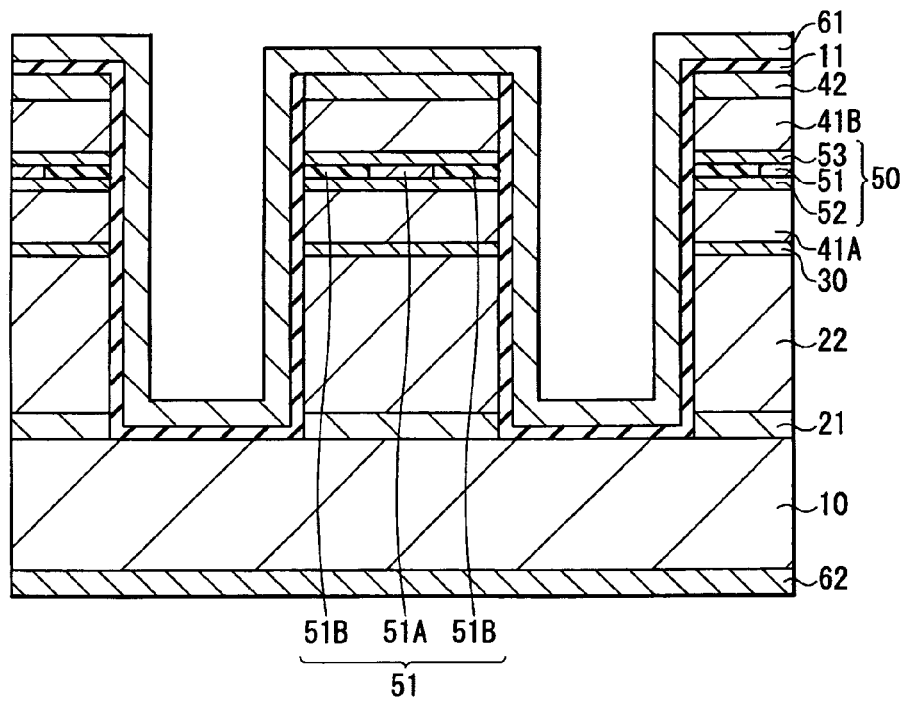

After the aperture is formed in the insulating film 11, as shown in FIG. 10B, on the whole area of the substrate 10, for example, by vacuum vapor deposition method, titanium, platinum, and gold are sequentially laminated and alloyed to form the p-side electrode 61. After the p-side electrode 61 is formed, the substrate 10 is ground to obtain a thickness of, for example, about 150 µm. Then, similarly as shown in FIG. 10B, as in the p-side electrode 61, on the whole area of the other side of the substrate 10, for example, by vacuum vapor deposition method, gold, AuGe, and gold are sequentially laminated and alloyed to form the n-side electrode 62.

After the n-side electrode 62 and the p-side electrode 61 are formed, the substrate 10 is adjusted to a given size, and unshown reflector films are formed on the pair of opposed resonator end faces in the resonator length direction. Thereby, the laser diode shown in FIG. 4 is completed.

In this laser diode, when a given voltage is applied between the n-side electrode 62 and the p-side electrode 61, a current is constricted by the non-conductive region 51B of the current confinement layer 51, and then injected into the current injection region 30A of the active layer 30. Then, light emitting is generated by electron-hole recombination. This light is reflected by the unshown pair of reflector films, travels between them, generates laser oscillation, and is emitted outside as the laser beam LB. Here, since the intermediate layers 52 and 53 are provided between the current confinement layer 51 and the first p-type cladding layer 41A, the second p-type cladding layer 41B, the mixed crystal is prevented from being formed between the current confinement layer 51 and the first p-type cladding layer 41A, the second p-type cladding layer 41B, which contain different Group V elements, and reproducibility of oxidation is improved. Therefore, stable electrical characteristics can be obtained.

As above, in this embodiment, the intermediate layers 52 and 53 as a buffer layer are sandwiched between the current confinement layer 51 and the first p-type cladding layer 41A, the second p-type cladding layer 41B. Therefore, it is possible to prevent the current confinement layer 51 and the first p-type cladding layer 41A, the second p-type cladding layer 41B, which contain different Group V elements from being directly contacted, so that the mixed crystal is prevented from being formed in the interface therebetween, and reproducibility of oxidation can be improved. Therefore, stable electrical characteristics can be obtained. In addition, reproducibility of effect of strain applied to the active layer by oxidation can be improved. As a result, controllability of polarization plane can be enhanced.

EXAMPLE

Further, descriptions will be given of a specific example of the invention.

As in the foregoing embodiment, a laser diode was fabricated. Then, by water vapor bubbled by $N_2$, the non-oxidized layer 71 is oxidized to form the current confinement layer 51. The oxidation temperature was 450° C., the flow rate was 1 l/min, and the oxidation time was 10 min. Under the same oxidation conditions, two more laser diodes were fabricated. Regarding the obtained three laser diodes (samples 1 to 3), a width w1 of the nonconductive region 51B was measured. The results thereof are shown in Table 1.

TABLE 1

| | | Width of nonconductive region (µm) |
|---|---|---|
| Example | Sample 1 | 1.82 |
| | Sample 2 | 1.85 |
| | Sample 3 | 1.7 |
| Comparative example | Sample 1 | 2.56 |
| | Sample 2 | 1.85 |
| | Sample 3 | 2.28 |

Comparative Example

Figure 1:
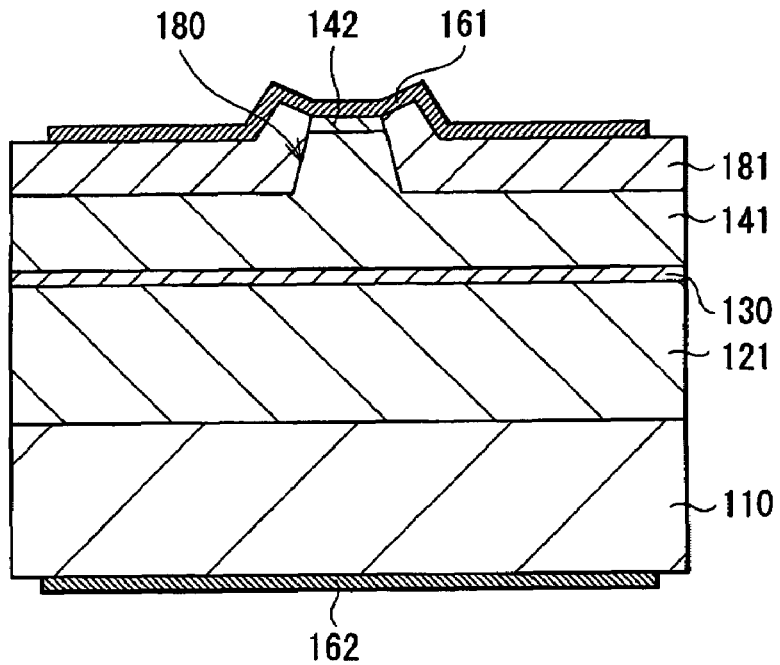
FIG. 1 is a cross section showing a construction example of a traditional laser diode.
Figure 2:
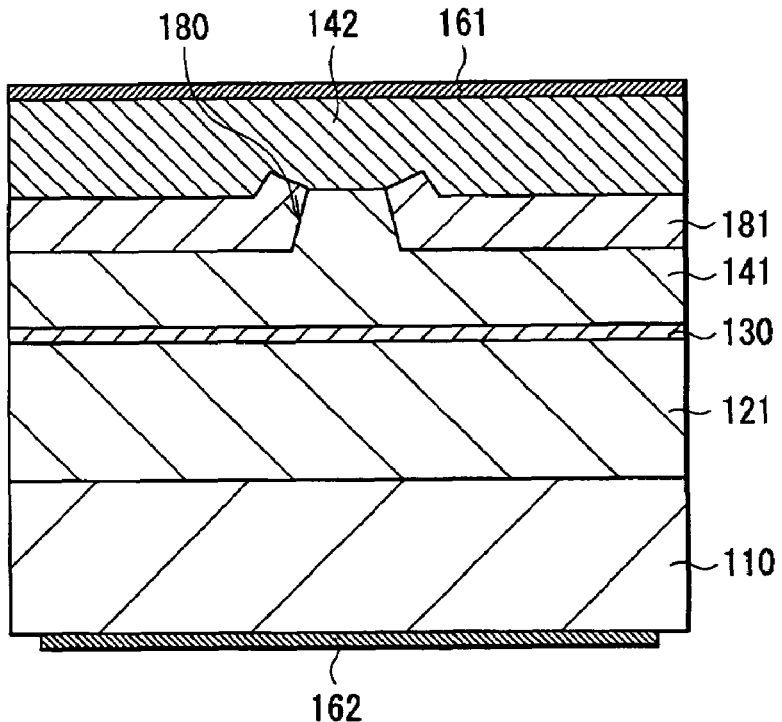
FIG. 2 is a cross section showing another construction example of a traditional laser diode.
Figure 3:
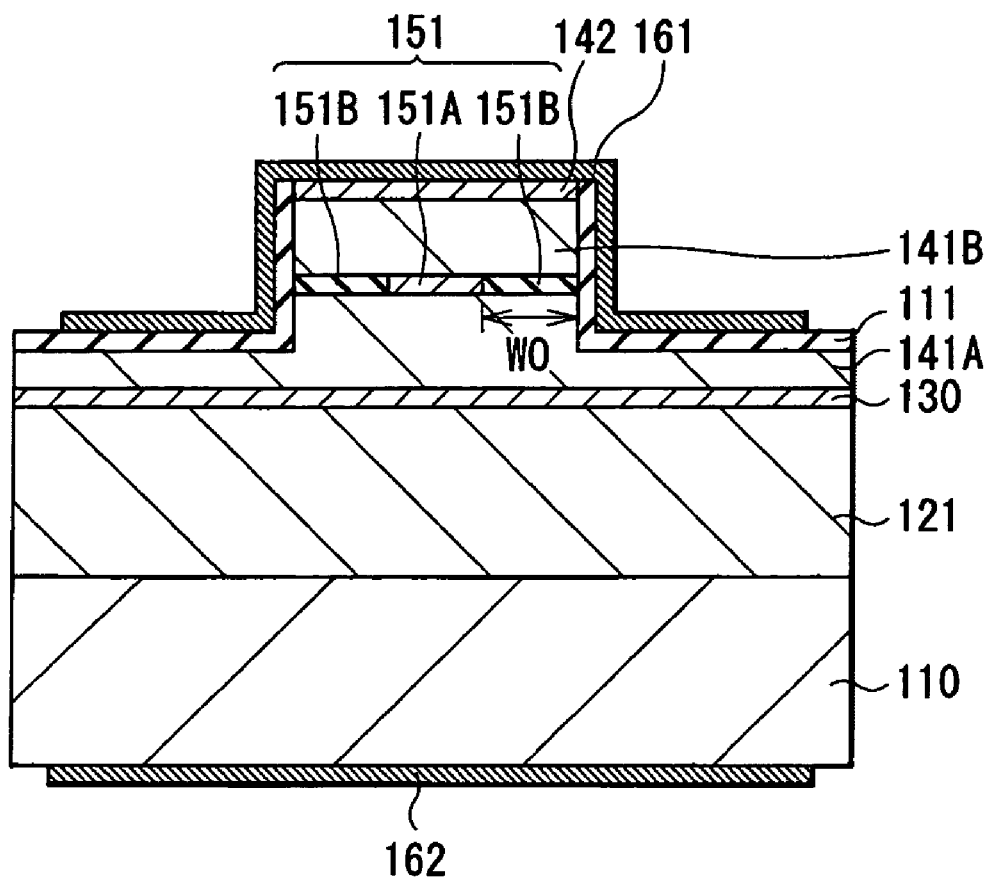
FIG. 3 is a cross section showing still another construction example of a traditional laser diode.

The laser diode having a traditional structure shown in FIG. 3, that is, the laser diode, in which only the current confinement layer 151 was provided between the first p-type cladding layer 141A and the second p-type cladding layer 141B, and the intermediate layers were not provided was fabricated. Under oxidation conditions similar to of Example, three laser diodes were fabricated. Regarding the obtained three laser diodes (samples 1 to 3), as in the foregoing Example, the width w0 of the nonconductive region 151B was measured. The results thereof are shown in Table 1 as well.

As evidenced by Table 1, according to Example, fluctuation of the width of the nonconductive region was small and reproducibility was excellent compared to Comparative example. That is, it was found that when the intermediate layers 52 and 53 were provided between the current confinement layer 51 and the first p-type cladding layer 41A or the second p-type cladding layer 41B, reproducibility of the current confinement layer 51 by oxidation could be improved.

Though the invention has been described with reference to the embodiment and the example, the invention is not limited to the foregoing embodiment and the example, and various modifications may be made. For example, the materials, the thicknesses, the deposition methods, the deposition conditions and the like, which have been described in the foregoing embodiment and the foregoing example are not limited. Other material, other thickness, other deposition method, and other deposition conditions may be applied. For example, the material of the active layer 30 may be other Group III-V compound semiconductor including at least one of aluminum (Al), gallium (Ga) and indium (In) of Group III elements, and phosphorus (P) of Group V elements such as an AlGaInP mixed crystal.

Further, in the foregoing embodiment and the foregoing example, the case that the current confinement part 50 has the three layer laminated structure including the current confinement layer 51 and the two intermediate layers 52 and 53 arranged with the current confinement layer 51 inbetween has been described. However, the current confinement part 50 may have a four or more layer laminated structure including other layers in addition to the three layers.

Further, it is not necessary that the intermediate layers 52 and 53 are provided above and below the current confinement layer 51. For example, in the case of forming either the first p-type cladding layer 41A or the second p-type cladding layer 41B of an AlGaAs mixed crystal having not so large aluminum composition, the intermediate layer on the side of the AlGaAs may be omitted and provided only on the AlGaInP side.

Figure 11:
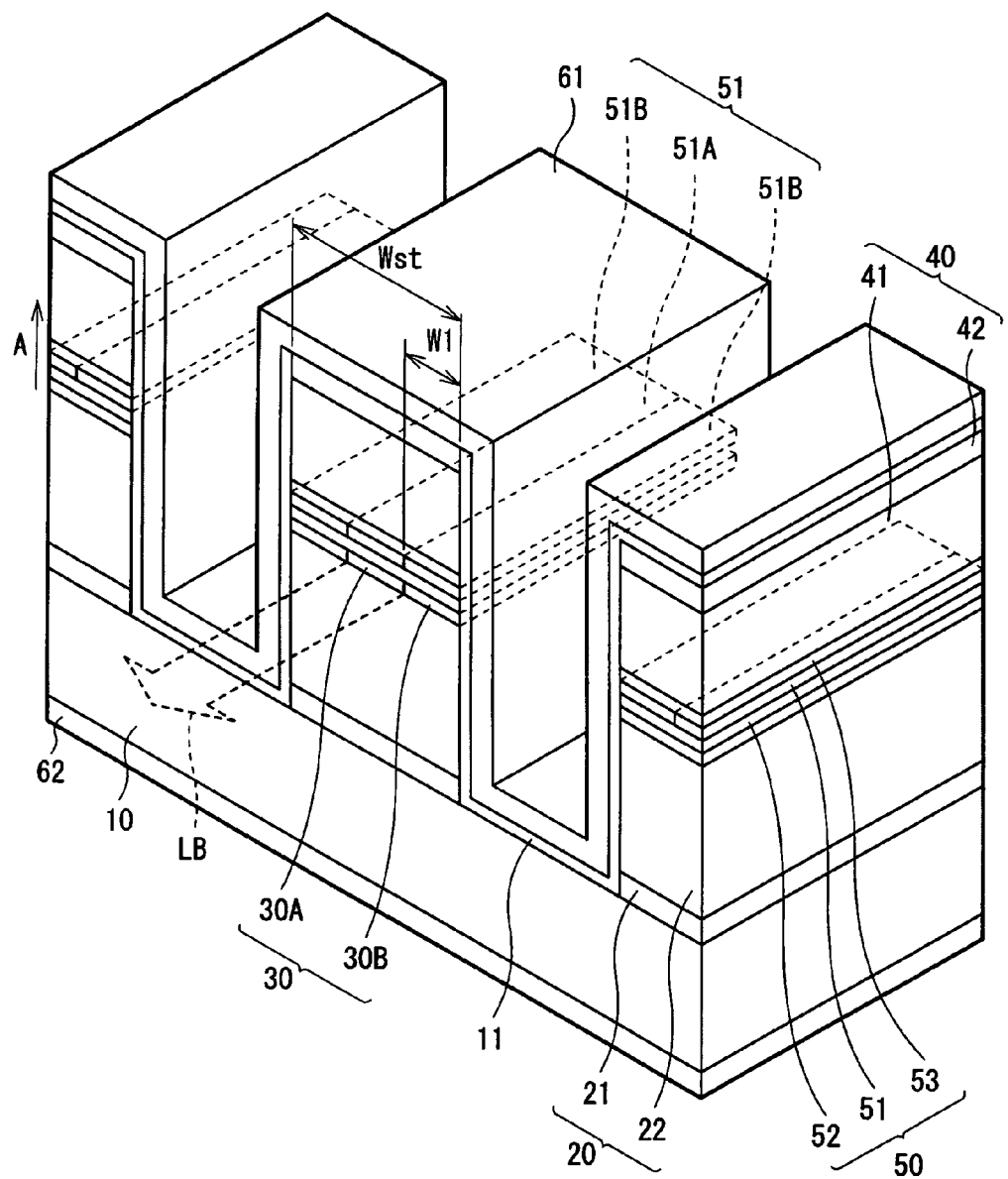
FIG. 11 is a perspective view showing another construction of a laser diode according to an embodiment of the invention.

Furthermore, in the foregoing embodiment and the foregoing example, the case that the current confinement part 50 is provided between the first p-type cladding layer 41A and the second p-type cladding layer 41B has been described. However, the current confinement part 50 may be provided on other position. For example, as shown in FIG. 11, the current confinement part 50 may be provided between the p-type cladding layer 41 and the active layer 30.

In addition, for example, in the foregoing embodiment and the example, the construction of the laser diode has been described with the specific example. However, the laser diode does not necessarily include all layers, but may further include other layers. For example, it is possible to provide a guide layer for light confinement between the n-type cladding layer 22 and the active layer 30, and between the active layer 30 and the first p-type cladding layer 41A.

Figure 12:
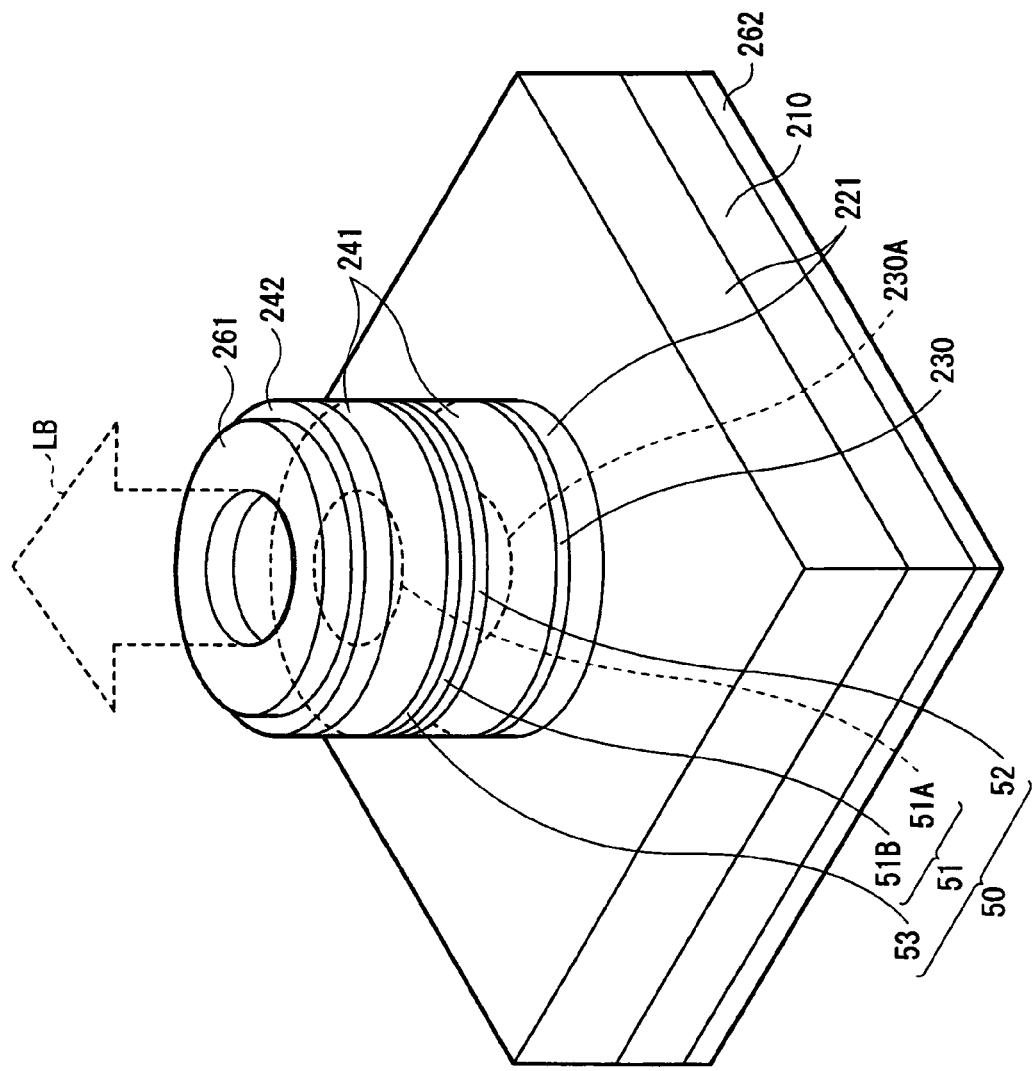
FIG. 12 is a perspective view showing still another construction of a laser diode according to an embodiment of the invention.

In addition, in the foregoing embodiment and the foregoing example, the edge-emitting laser diode has been described as an example. However, it is possible to apply to the VCSEL (Vertical Cavity Surface Emitting Laser) as well. FIG. 12 shows an example of the construction thereof. In the laser diode shown in FIG. 12, on the upper side of a substrate 210 made of n-type GaAs, an n-type multilayer reflective film 221 alternately laminating an AlInP mixed crystal layer and an AlGaInP mixed crystal layer, an active layer 230 having a multiquantum well structure alternately laminating a GaInP mixed crystal layer and an AlGaInP mixed crystal layer, a p-type multilayer reflective film 241 alternately laminating an AlInP mixed crystal layer and an AlGaInP mixed crystal layer and a p-side contact layer 242 made of p-type GaAs are laminated, and the current confinement part 50 is provided in the p-type multilayer reflective film 241. On the p-side contact layer 242, a p-side electrode 261 is formed through an aperture provided in an insulating film (not shown). On the backside of the substrate 210, an n-side electrode 262 is formed.

The current confinement part 50 has the current confinement layer 51 and the intermediate layers 52 and 53 between the current confinement layer 51 and the p-type multilayer reflective film 241 like the foregoing embodiment. The conductive region 51A of the current confinement layer 51 and a current injection region 230A of the active layer 230 are formed in a circle. The nonconductive region 51B is formed circularly around the conductive region 51A. The light generated in the active layer 230 is emitted as a laser bean LB in the same direction as the lamination direction of the active layer 230 and the current confinement part 50.

Figure 13:
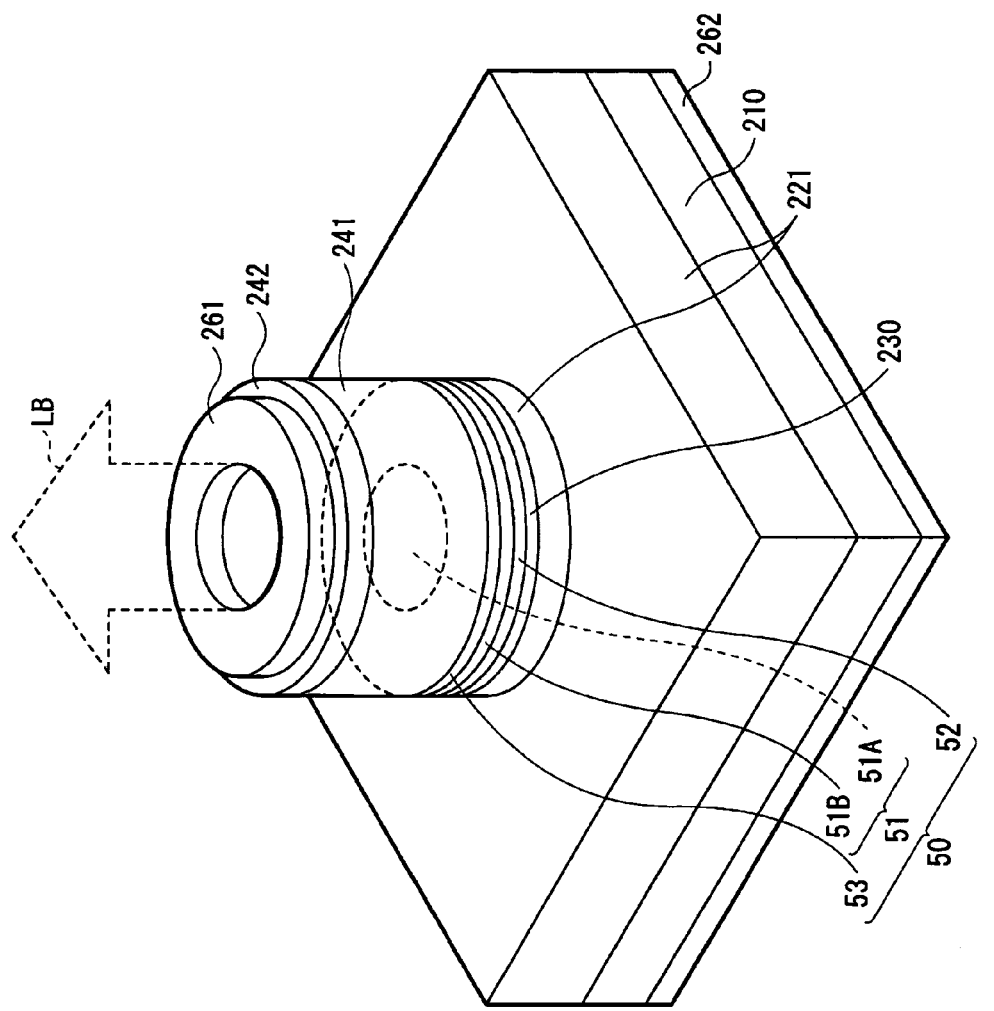
FIG. 13 is a perspective view showing still another construction of a laser diode according to an embodiment of the invention.

The current confinement part 50 may be provided between the active layer 230 and the p-type multilayer reflective film 241 as shown in FIG. 13.

Figure 14:
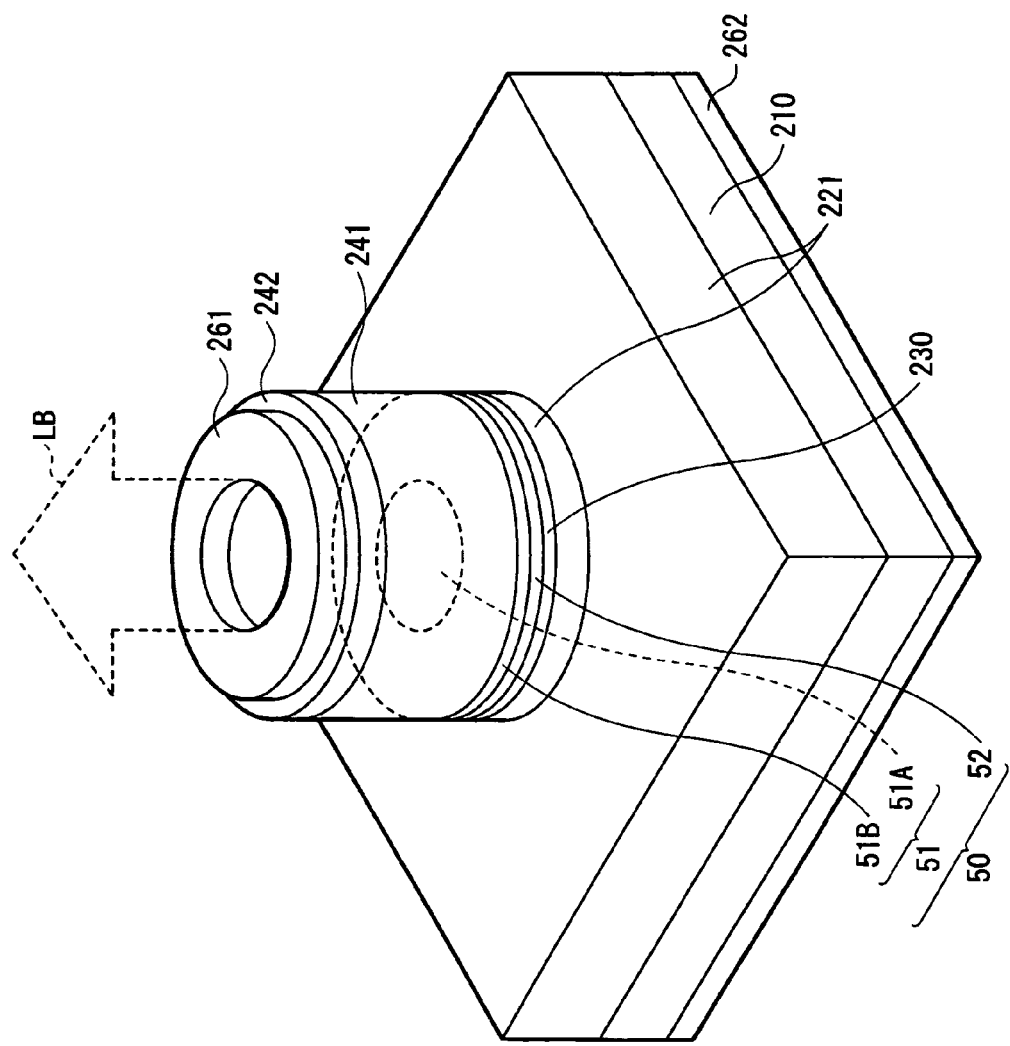
FIG. 14 is a perspective view showing still another construction of a laser diode according to an embodiment of the invention.

In the case of forming the current confinement part 50 between the active layer 230 and the p-type multilayer reflective film 241, if the p-type multilayer reflective film 241 is made of a material not including phosphorus such as an AlGaAs mixed crystal, the intermediate layer 52 may be provided only between the current confinement layer 51 and the active layer 230 and the intermediate layer between the current confinement layer 51 and the p-type multilayer reflective film 241 can be omitted as shown in FIG. 14. The multilayer reflective film made of AlGaAs material includes a laminate alternately laminating an AlAs layer and an $Al_{0.5}Ga_{0.5}As$ mixed crystal layer, for example.

Figure 15:
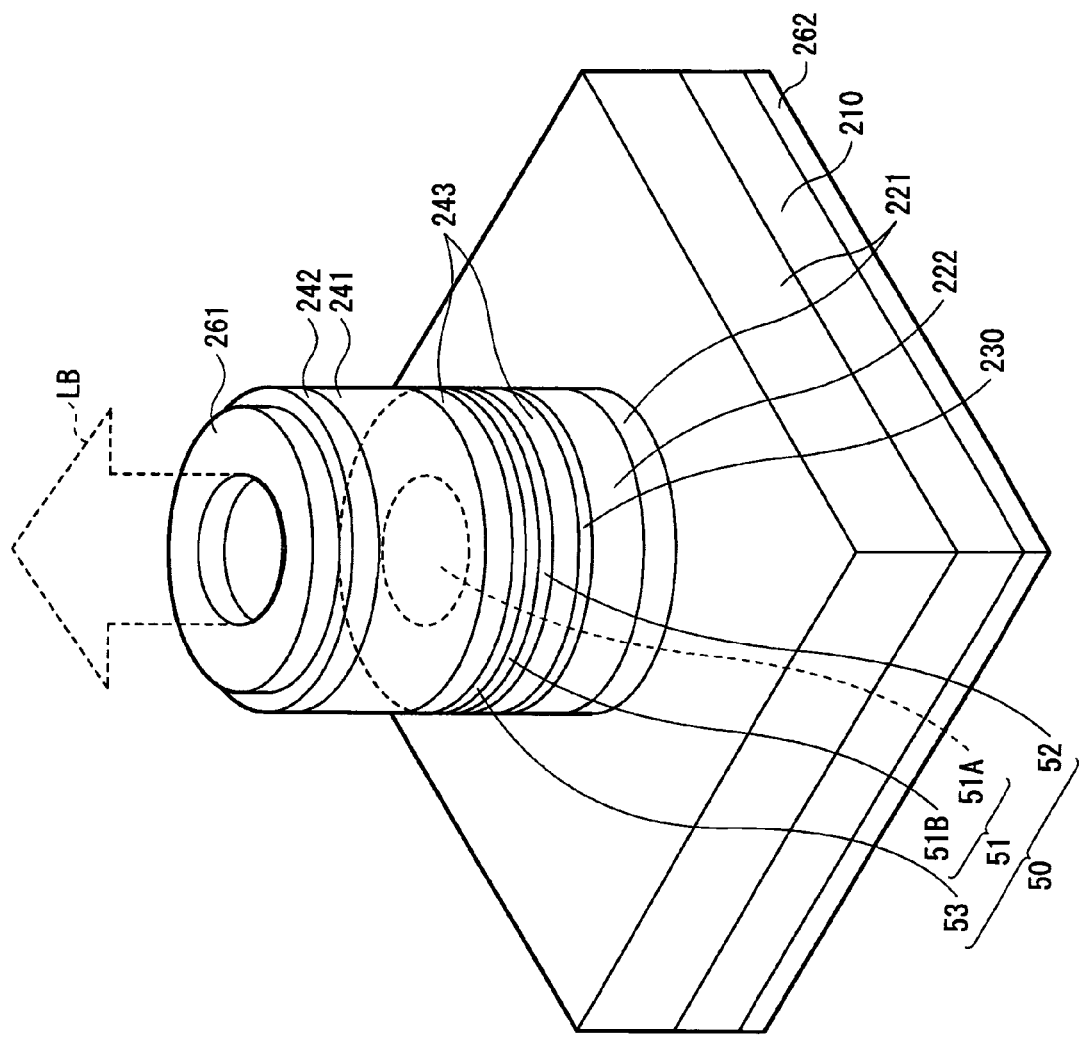
FIG. 15 is a perspective view showing still another construction of a laser diode according to an embodiment of the invention.

Further, the invention is not limited to the structure shown in FIG. 12 to FIG. 14 and is applicable to edge-emitting laser diodes having another structure. For example, as shown in FIG. 15, an n-type multilayer reflective film 221, a first guide layer 222 made of an AlGaInP mixed crystal, the active layer 230, a second guide layer 243 made of an AlGaInP mixed crystal, the p-type multilayer reflective film 241 and the p-side contact layer 242 may be sequentially laminated on the upper face of the substrate 210 and the current confinement part 50 may be provided in the second guide layer 243.

Figure 16:
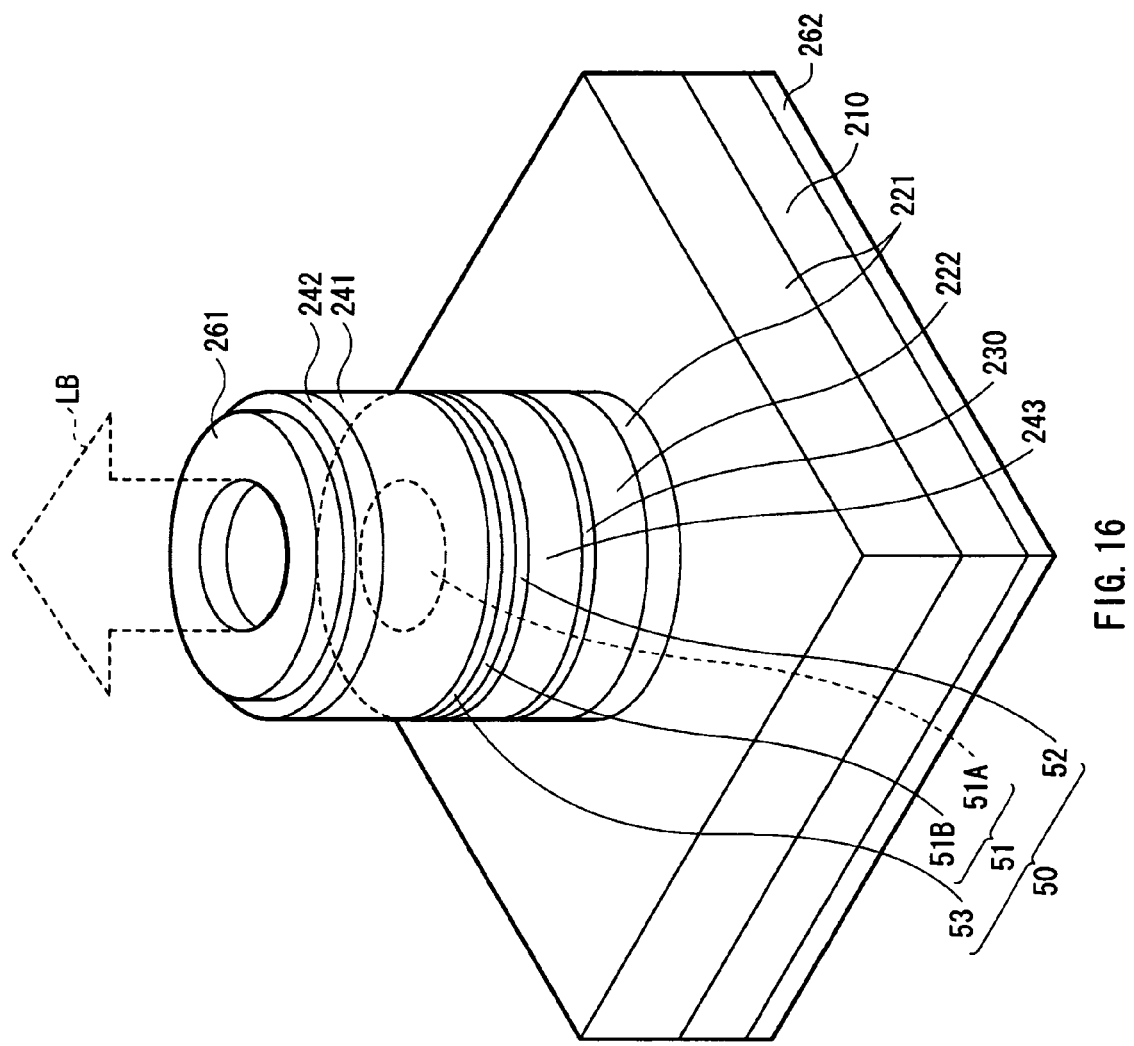
FIG. 16 is a perspective view showing still another construction of a laser diode according to an embodiment of the invention.
Figure 17:
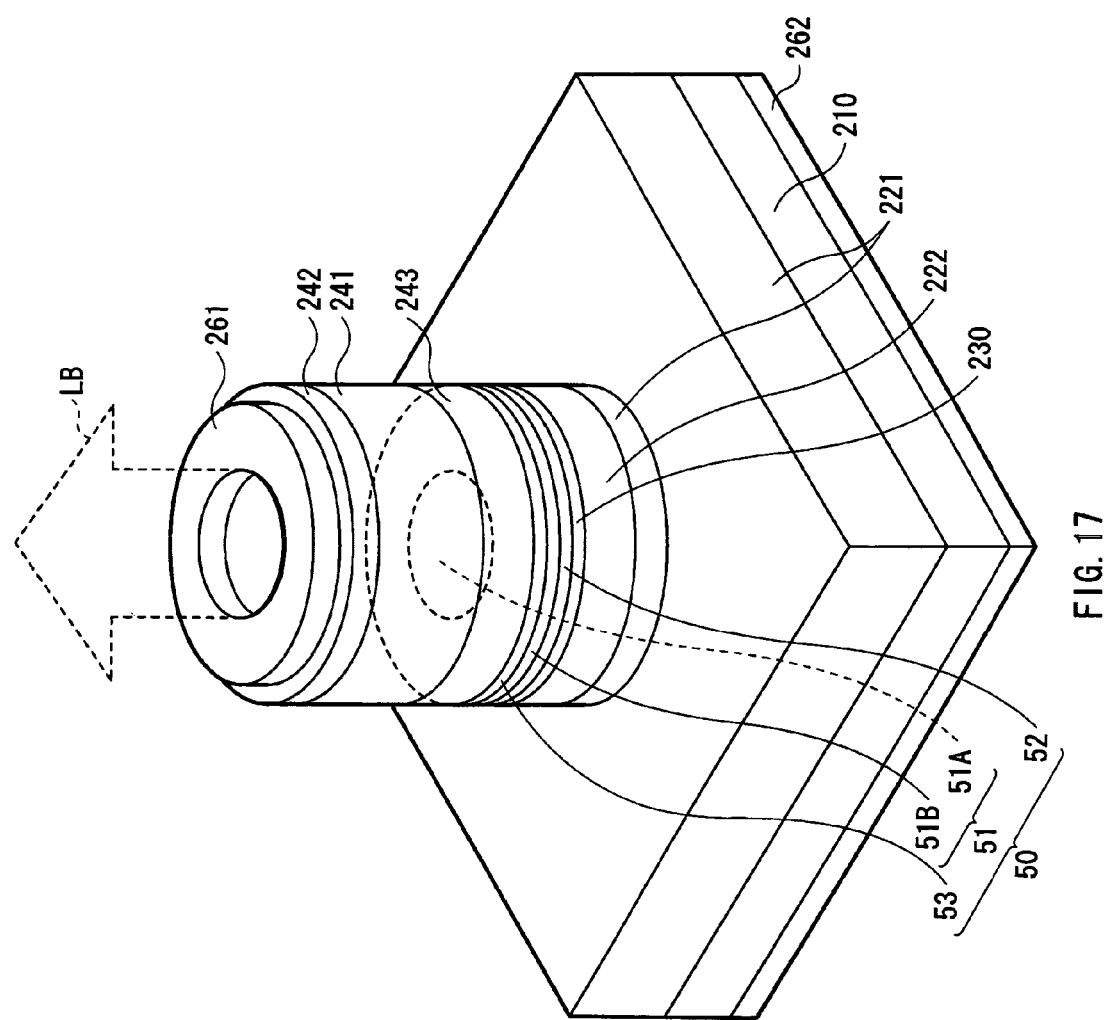
FIG. 17 is a perspective view showing still another construction of a laser diode according to an embodiment of the invention.

In this case, the current confinement part 50 may be provided between the second guide layer 243 and the p-type multilayer reflective film 241 as shown in FIG. 16, or between the active layer 230 and the second guide layer 243 as shown in FIG. 17. Further, depending on the material of the second guide layer 243 or the p-type multilayer reflective film 241, the intermediate layer between the current confinement layer 51 and the second guide layer 243 or the intermediate layer between the current confinement layer 51 and the p-type multilayer reflective film 241 can be omitted.

The semiconductor light emitting device according to the embodiment of the invention can be applied to, for example, a light source for optical fiber communications or optical wiring, a light source for a laser printer, or an optical disc.

It should be understood by those skilled in the art that various modifications, combinations, sub-combinations and alternations may occur depending on design requirements and other factors insofar as they are within the scope of the appended claims or the equivalents thereof.

What is claimed is:

1. A semiconductor light emitting device comprising:
   a substrate;
   a first semiconductor layer;
   an active layer on the first semiconductor layer;
   a second semiconductor layer on the active layer;
   a current confinement part in the second semiconductor layer, or between the active layer and the second semiconductor layer; and
   an intermediate layer made of a compound semiconductor which is between the current confinement layer and the second semiconductor layer or between the current confinement layer and the active layer, wherein, the current confinement part limits a current injection region of the active layer, the current confinement part includes a current confinement layer having a conductive region corresponding to the current injection region of the active layer and a nonconductive region corresponding to a region other than the current injection region of the active layer, the intermediate layer is effective to prevent the formation of a mixed crystal of phosphorous and arsenic between the current confinement layer and the second semiconductor layer or the active layer, respectively, the intermediate layer is made of a Group III-V compound semiconductor containing at least one of aluminum (Al) and gallium (Ga) among Group 3B elements and at least arsenic (As) among Group 5B elements, the second semiconductor layer or the active layer is made of a Group III-V compound semiconductor containing at least one of aluminum (Al), gallium (Ga), and indium (In) among Group 3B elements and at least phosphorous (P) among Group 5B elements, and the conductive region of the current confinement layer is made of a Group III-V compound semiconductor containing at least aluminum (Al) among Group 3B elements and at least arsenic (As) among Group 5B elements and the nonconductive region of the current confinement layer is made of an insulating oxide containing aluminum (Al).

2. A semiconductor light emitting device according to claim 1, wherein, the second semiconductor layer is made of an AlGaInP mixed crystal, the active layer is made of an AlGaInP mixed crystal or a GaInP mixed crystal, the intermediate layer is made of an AlGaAs mixed crystal, the conductive region of the current confinement layer is made of AlAs, and the nonconductive region of the current confinement layer is made of an insulating oxide containing aluminum (Al).

3. A semiconductor light emitting device according to claim 2, wherein a composition of aluminum contained in the intermediate layer is 0.4 or more.

4. A semiconductor light emitting device according to claim 2, wherein a composition of aluminum contained in the intermediate layer is 0.9 or less.

5. A semiconductor light emitting device according to claim 1, wherein light generated in the active layer is emitted in a direction perpendicular to the lamination direction of the active layer and the current confinement part.

6. A semiconductor light emitting device according to claim 1, wherein the conductive region of the current confinement layer and the current injection region of the active layer are formed in the shape of a stripe, and the nonconductive region is formed in the shape of a stripe on both sides of the conductive region.

7. A semiconductor light emitting device according to claim 1, wherein light generated in the active layer is emitted in the same direction as a lamination direction of the active layer and the current confinement layer.

8. A semiconductor light emitting device according to claim 1, wherein the conductive region of the current confinement layer and the current injection region of the active layer is formed into a circle and the nonconductive region is formed circularly around the conductive region.

* * * * *